(12) United States Patent
Kim et al.

(10) Patent No.: US 11,658,039 B2
(45) Date of Patent: May 23, 2023

(54) PLASMA ETCHING APPARATUS, PLASMA ETCHING METHOD, AND SEMICONDUCTOR DEVICE FABRICATION METHOD INCLUDING THE PLASMA ETCHING METHOD

(71) Applicant: Samsung Electronics Co., Ltd., Suwon-si (KR)

(72) Inventors: Kyuho Kim, Hwaseong-si (KR); Nam Kyun Kim, Seoul (KR); Sungjun Ann, Seoul (KR); Myungsun Choi, Hwaseong-si (KR); Dougyong Sung, Seoul (KR); Seungbo Shim, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 8 days.

(21) Appl. No.: 17/370,705

(22) Filed: Jul. 8, 2021

(65) Prior Publication Data
US 2022/0020597 A1    Jan. 20, 2022

(30) Foreign Application Priority Data

Jul. 16, 2020   (KR) .......................... 10-2020-0088411

(51) Int. Cl.
*H01L 21/311*   (2006.01)
*H01L 21/683*   (2006.01)
*H01J 37/32*    (2006.01)

(52) U.S. Cl.
CPC .... *H01L 21/31116* (2013.01); *H01J 37/3244* (2013.01); *H01J 37/32146* (2013.01); *H01J 37/32165* (2013.01); *H01L 21/6833* (2013.01); *H01J 2237/3347* (2013.01)

(58) Field of Classification Search
None
See application file for complete search history.

(56) References Cited

U.S. PATENT DOCUMENTS

| | | |
|---|---|---|
| 6,746,961 B2 | 6/2004 | Ni et al. |
| 7,749,353 B2 | 7/2010 | Rusu et al. |
| 7,785,753 B2 * | 8/2010 | Kim ................ H01L 21/32139 430/311 |
| 8,501,627 B2 | 8/2013 | Chi et al. |
| 9,099,503 B2 | 8/2015 | Iwata |
| 9,478,387 B2 | 10/2016 | Ooya et al. |
| 9,812,349 B2 | 11/2017 | Angelov et al. |
| 9,852,922 B2 | 12/2017 | Watanabe et al. |
| 10,395,894 B2 | 8/2019 | Shoeb et al. |
| 10,622,217 B2 | 4/2020 | Park et al. |

(Continued)

FOREIGN PATENT DOCUMENTS

CN    107039263 A    8/2017

*Primary Examiner* — Roberts P Culbert
(74) *Attorney, Agent, or Firm* — Muir Patent Law, PLLC

(57) ABSTRACT

Disclosed are plasma etching apparatuses, plasma etching methods, and semiconductor device fabrication methods. The plasma etching apparatus comprises a chamber, an electrostatic chuck in a lower portion of the chamber, a radio-frequency power supply that has a connection with the electrostatic chuck and provides the electrostatic chuck with a radio-frequency power to generate a plasma in the chamber, and a controller that has a connection with the radio-frequency power supply and controls the radio-frequency power.

10 Claims, 17 Drawing Sheets

(56) References Cited

U.S. PATENT DOCUMENTS

| | | |
|---|---|---|
| 2005/0070117 A1 | 3/2005 | Jacobs et al. |
| 2008/0236750 A1 | 10/2008 | Koshimizu |
| 2009/0004873 A1 | 1/2009 | Yang et al. |
| 2017/0229312 A1 | 8/2017 | Park et al. |
| 2020/0234964 A1 | 7/2020 | Park et al. |
| 2020/0234965 A1 | 7/2020 | Park et al. |
| 2021/0104382 A1* | 4/2021 | Kim ................ H01J 37/32706 |

* cited by examiner

PLASMA ETCHING APPARATUS, PLASMA ETCHING METHOD, AND SEMICONDUCTOR DEVICE FABRICATION METHOD INCLUDING THE PLASMA ETCHING METHOD

CROSS-REFERENCE TO RELATED APPLICATION

This U.S. nonprovisional application claims priority under 35 U.S.C § 119 to Korean Patent Application No. 10-2020-0088411 filed on Jul. 16, 2020 in the Korean Intellectual Property Office, the entire disclosure of which is hereby incorporated by reference in its entirety.

BACKGROUND

The present inventive concepts relate to semiconductor device fabrication apparatus and methods, and more particularly, to a plasma etching apparatus, a plasma etching method, and a semiconductor device fabrication method including the plasma etching method.

In general, a semiconductor device is manufactured by employing a plurality of unit processes. The unit processes may include a deposition process, a photolithography process, and an etching process. A plasma may be commonly used to perform the deposition and etching processes. The plasma may treat a substrate under high temperature conditions. A radio-frequency power may be mainly used to produce the plasma.

SUMMARY

Some example embodiments of the present inventive concepts provide a plasma etching apparatus capable of increasing an aspect ratio of a channel hole on a substrate, a plasma etching method, and a semiconductor device fabrication method including the plasma etching method.

According to some example embodiments of the present inventive concepts, a plasma etching apparatus may comprise: a chamber; an electrostatic chuck in a lower portion of the chamber and on which a substrate is disposed; a radio-frequency power supply that has a connection with the electrostatic chuck and provides the electrostatic chuck with a radio-frequency power to generate a plasma in the chamber; and a controller that has a connection with the radio-frequency power supply and controls the radio-frequency power. The radio-frequency power supply may include: a first radio-frequency power supply that provides a first radio-frequency power having a first frequency; a second radio-frequency power supply that provides a second radio-frequency power having a second frequency, the second frequency being less than the first frequency; and a third radio-frequency power supply that provides a third radio-frequency power having a third frequency, the third frequency being less than the second frequency. The controller may provide the second radio-frequency power from 3 times to 5 times the first radio-frequency power.

According to some example embodiments of the present inventive concepts, a plasma etching method using a plasma may comprise: providing an electrostatic chuck with a first radio-frequency power having a first frequency; providing a second radio-frequency power having a second frequency, the second radio-frequency power being greater than the first radio-frequency power, and the second frequency being less than the first frequency; and providing a third radio-frequency power having a third frequency, the third radio-frequency power being less than the second radio-frequency power, and the third frequency being less than the second frequency. The second radio-frequency power is from 3 times to 5 times the first radio-frequency power.

According to some example embodiments of the present inventive concepts, a semiconductor device fabrication method may comprise: allowing an electrostatic chuck to load a substrate having an etch target; and etching the etch target using a plasma. The step of etching the etch target may include: providing the electrostatic chuck with a first radio-frequency power having a first frequency; providing a second radio-frequency power having a second frequency the second radio-frequency power being greater than the first radio-frequency power, and the second frequency being less than the first frequency; and providing a third radio-frequency power having a third frequency, the third radio-frequency power being less than the second radio-frequency power, and the third frequency being less than the second frequency. The second radio-frequency power is from 3 times to 5 times the first radio-frequency power.

DETAILED DESCRIPTION OF EMBODIMENTS

Figure 1:
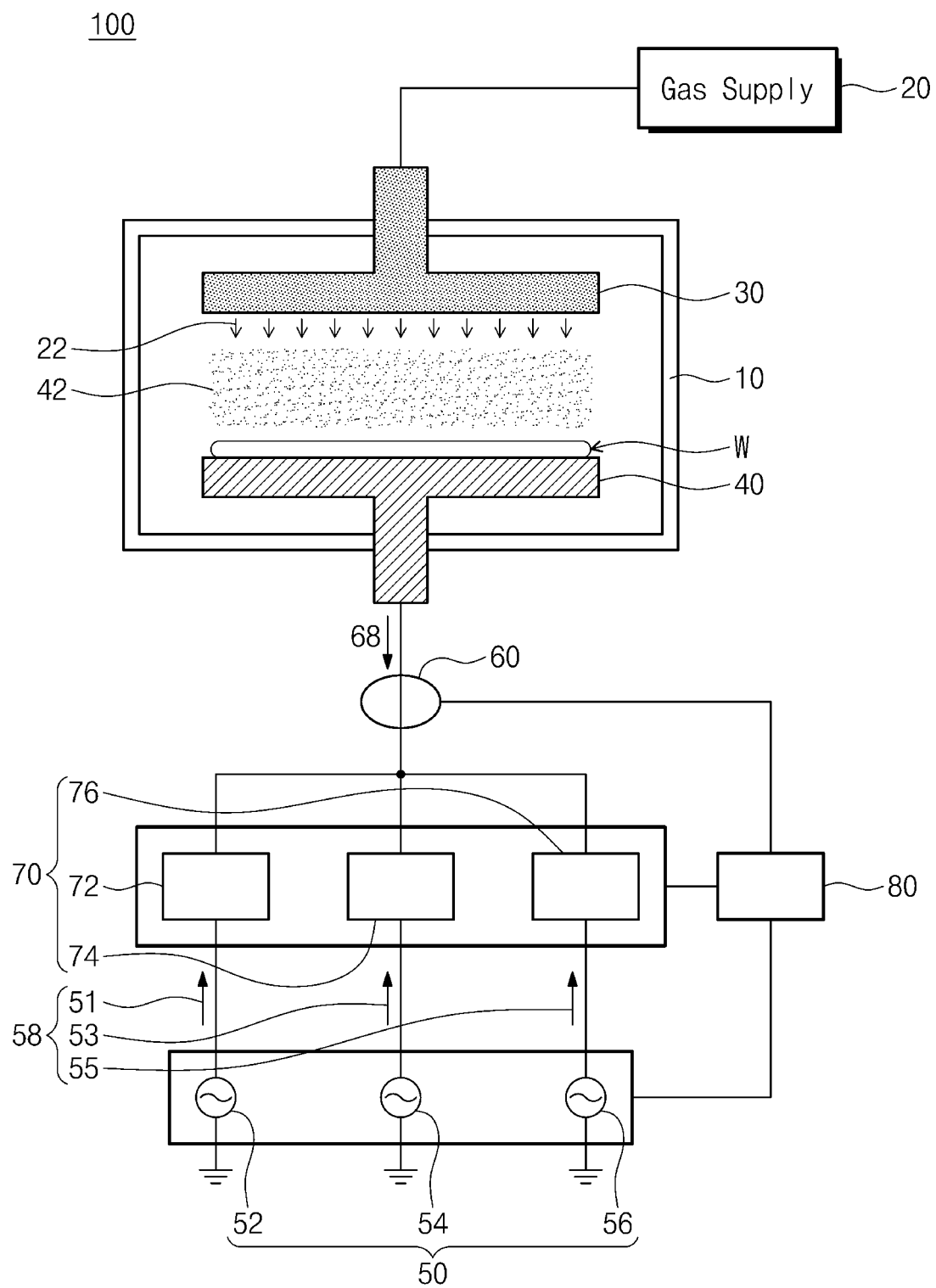
FIG. 1 illustrates a schematic diagram showing an example of a plasma etching apparatus according to the present inventive concepts.

FIG. 1 shows an example of a plasma etching apparatus 100 according to the present inventive concepts.

Referring to FIG. 1, the plasma etching apparatus 100 according to the present inventive concepts may be a capacitively coupled plasma (CCP) etching apparatus. Alternatively, the plasma etching apparatus 100 may be an inductively coupled plasma (ICP) apparatus, but the present inventive concepts are not limited thereto. In an implementation, the plasma etching apparatus 100 may include a chamber 10, a gas supply 20, a showerhead 30, an electrostatic chuck 40, a power supply 50, a current sensor 60, a radio-frequency (RF) matcher 70, and a controller 80.

The chamber 10 may provide a processing space within which a semiconductor process (e.g., a plasma etching process) is performed. In an implementation, the chamber 10 may have a hermetically sealed space of a certain size at the interior thereof. The chamber 10 may be variously shaped according to the size or the like of a substrate W or another suitable workpiece. For example, the chamber 10 may have a cylindrical shape that corresponds to a disk shape of the substrate W, but the present inventive concepts are not limited thereto.

The gas supply 20 may be installed outside the chamber 10. The gas supply 20 may supply the chamber 10 with a process gas 22. For example, the process gas 22 may include at least one selected from CF4, C4F6, C4F8, COS, CHF3, HBr, SiCl4, O2, N2, H2, NF3, SF6, He, and Ar, but the present inventive concepts are not limited thereto.

The showerhead 30 may be disposed in an upper portion of the chamber 10. The showerhead 30 may be associated with the gas supply 20. The showerhead 30 may provide the process gas 22 onto the substrate W.

The electrostatic chuck 40 may be disposed in a lower portion of the chamber 10. The electrostatic chuck 40 may load the substrate W. The electrostatic chuck 40 may use an electrostatic voltage to hold the substrate W.

The power supply 50 may be installed outside the chamber 10. The power supply 50 may be associated with the electrostatic chuck 40. The power supply 50 may provide the electrostatic chuck 40 with a radio-frequency (RF) power 58 to induce a plasma 42 on the substrate W. For example, the power supply 50 may include a first power supply 52, a second power supply 54, and a third power supply 56. Based on a frequency of the RF power 58, the first power supply 52, the second power supply 54, and the third power supply 56 may respectively generate a first RF power 51, a second RF power 53, and a third RF power 55. A fourth power supply, or more power supplies, may also be provided, generating additional RF powers.

Figure 2:
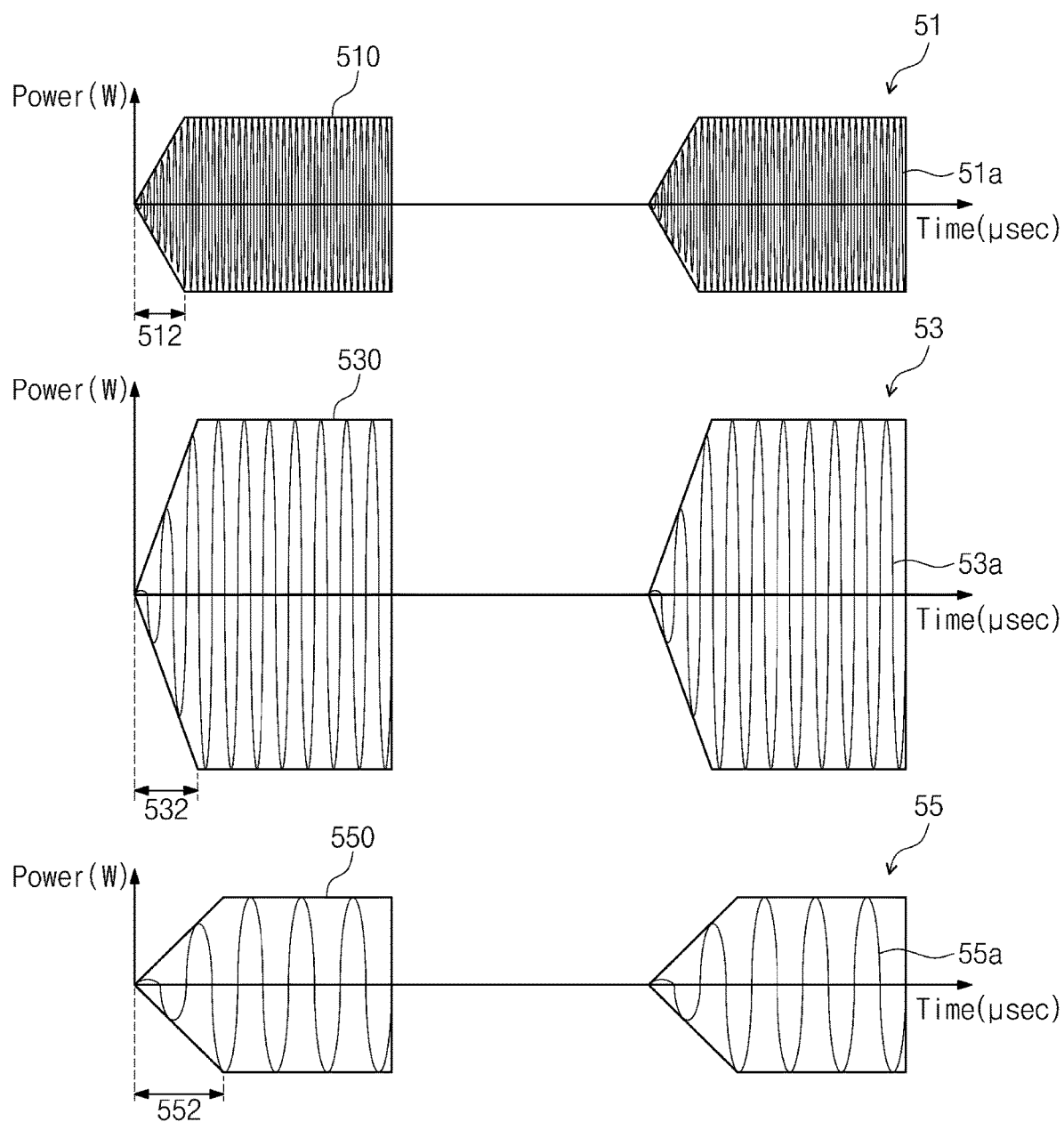
FIG. 2 illustrates graphs showing examples of a first radio-frequency power, a second radio-frequency power, and a third radio-frequency power of FIG. 1.

FIG. 2 shows examples of the first RF power 51, the second RF power 53, and the third RF power 55 of FIG. 1.

Referring to FIGS. 1 and 2, the first power supply 52 may provide the electrostatic chuck 40 with the first RF power 51 to generate the plasma 42 on the substrate W. The first RF power 51 may be a source power of the plasma 42. In an implementation, the first RF power 51 may range from about 4 KW to about 6 KW. For example, the first RF power 51 may have a first frequency 51a. The first frequency 51a may be about 60 MHz. The first frequency 51a may be calculated into a first wavelength of about 5 m. Alternatively, the first frequency 51a may range from about 40 MHz to about 80 MHz, but the present inventive concepts are not limited thereto.

The second power supply 54 may provide the electrostatic chuck 40 with the second RF power 53 to concentrate the plasma 42 on the substrate W. The second RF power 53 may be a first bias power of the plasma 42. Alternatively, the second RF power 53 may increase ion energy of the plasma 42. In an implementation, the second RF power 53 may be greater than the first RF power 51. For example, the second RF power 53 may be about 3 times to about 5 times the first RF power 51. The second RF power 53 may be the same as or greater than the third RF power 55. For example, the second RF power 53 may range from about 12 KW to about 28 KW. The second RF power 53 may have a second frequency 53a. The second frequency 53a may be less than the first frequency 51a. The second frequency 53a may be about 2 MHz. The second frequency 53a may be calculated into a second wavelength (see $\lambda_2$ of FIG. 5) of about 150 m. The second wavelength $\lambda_2$ may be about 30 times the first wavelength $\lambda_1$. Alternatively, the second frequency 53a may range from about 1 MHz to about 20 MHz, but the present inventive concepts are not limited thereto.

The third power supply 56 may provide the third RF power 55 to accelerate the plasma 42 toward the substrate W. The third RF power 55 may be a second bias power of the plasma 42. The third RF power 55 may be the same as or greater than the first RF power 51. The third RF power 55 may be the same as or less than the second RF power 53. The third RF power 55 may be about 1/7 times to about 1 times the second RF power 53. For example, the third RF power 55 may range from about 4 KW to about 21 KW. The third RF power 55 may have a third frequency 55a. The third frequency 55a may be less than the second frequency 53a. The third frequency 55a may be about 400 KHz. The third frequency 55a may be calculated into a third wavelength (see $\lambda_3$ of FIG. 5) of about 750 m. The third wavelength $\lambda_3$ may be about 5 times the second wavelength $\lambda_2$. Alternatively, the third frequency 55a may range from about 10 KHz to about 900 KHz, but the present inventive concepts are not limited thereto.

Figure 3:
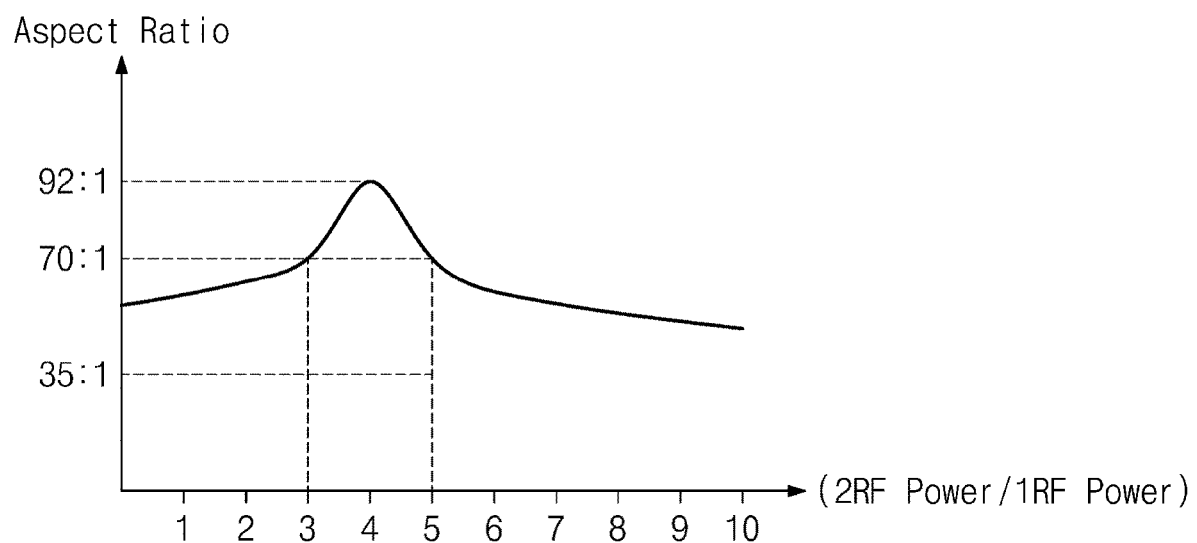
FIG. 3 illustrates a graph showing how an aspect ratio of a channel hole depends on a ratio of the second radio-frequency power to the first radio-frequency power of FIG. 2.

FIG. 3 shows how an aspect ratio of a channel hole (see 200 of FIG. 9) on the substrate W depends on a ratio of the second RF power 53 to the first RF power 51 of FIG. 2.

Referring to FIG. 3, when the second RF power 53 is about 3 times to about 5 times the first RF power 51, the aspect ratio of the channel hole 200 on the substrate W may increase to a value equal to or greater than about 70:1. When the second RF power 53 is about 4 times the first RF power 51, the aspect ratio may increase to maximum. The maximum aspect ratio may be about 92:1, but the present inventive concepts are not limited thereto.

Figure 4:
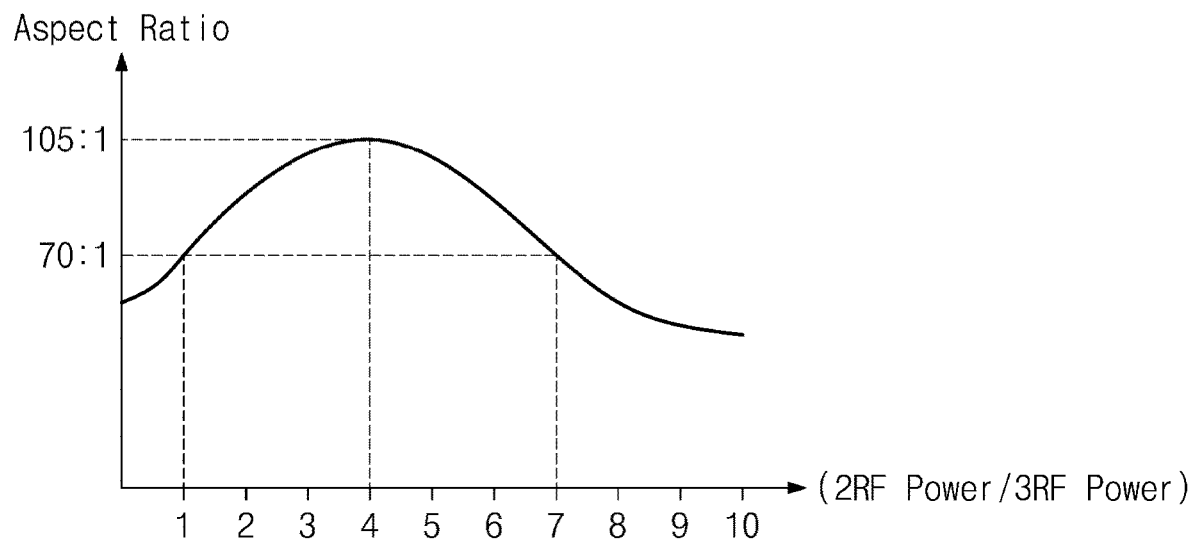
FIG. 4 illustrates a graph showing how an aspect ratio of a channel hole depends on a ratio of the second radio-frequency power to the third radio-frequency power of FIG. 2.

FIG. 4 shows how the aspect ratio of the channel hole 200 on the substrate W depends on a ratio of the second RF power 53 to the third RF power 55 of FIG. 2.

Referring to FIG. 4, when the second RF power 53 is about 1 times to about 7 times the third RF power 55, the aspect ratio of the channel hole 200 on the substrate W may increase to a value equal to or greater than about 70:1. When the second RF power 53 is about 4 times the third RF power 55, the aspect ratio may increase to maximum. The maximum aspect ratio may be about 105:1, but the present inventive concepts are not limited thereto.

Figure 5:
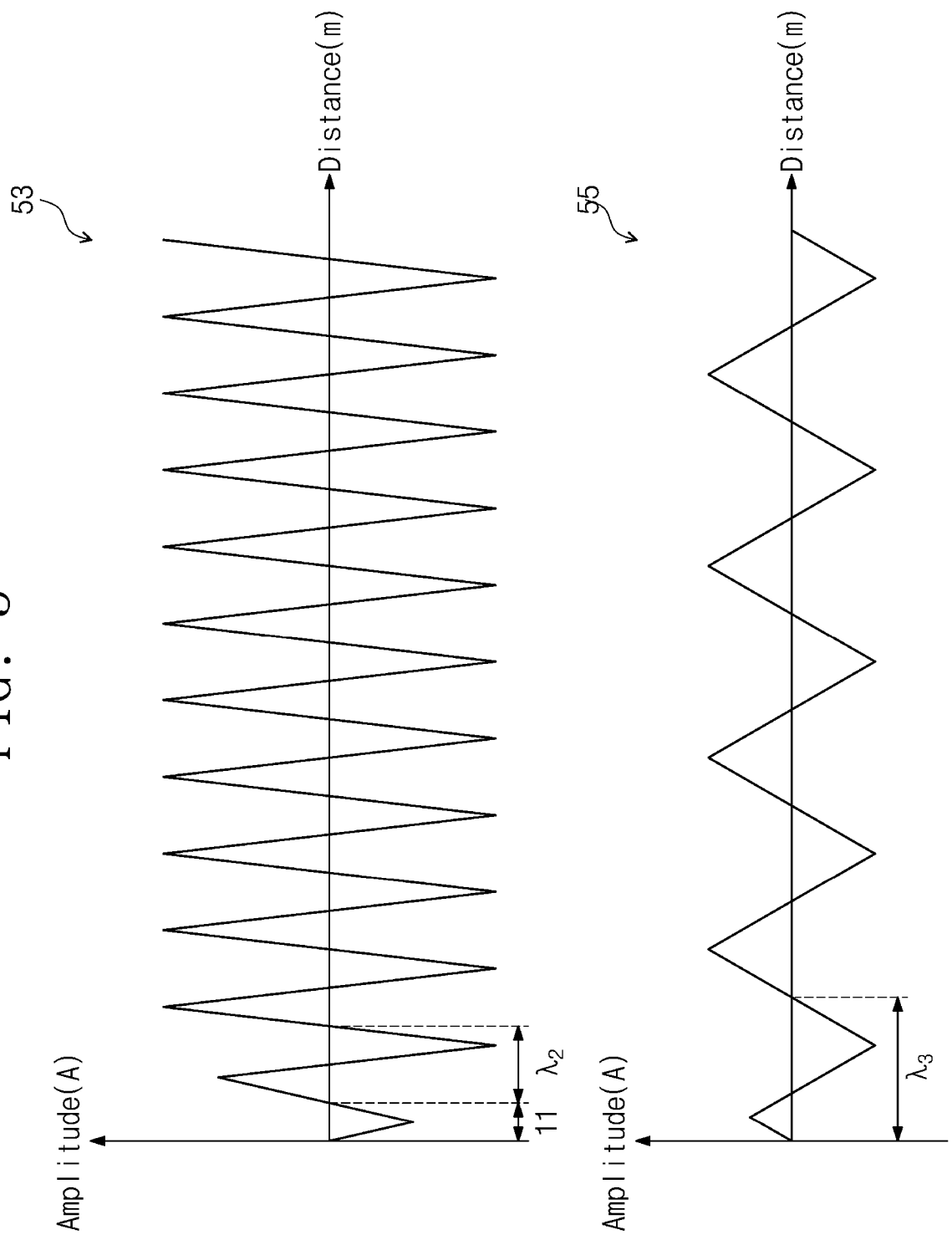
FIG. 5 illustrates graphs showing examples of the second radio-frequency power and the third radio-frequency power of FIG. 2.

FIG. 5 shows examples of the second RF power 53 and the third RF power 55 of FIG. 2.

Referring to FIG. 5, the second RF power 53 may have a phase ahead of that of the third RF power 55. In an implementation, there may be a phase difference 11 between the second RF power 53 and the third RF power 55. For example, the phase difference 11 may be one-half ($\lambda_2/2$, $\pi$ radians, or 180°) of the second wavelength $\lambda_2$ of the second RF power 53. When a second pulse 530 and a third pulse 550 are initially input, the second wavelength $\lambda_2$ of the second RF power 53 may be provided to precede and/or lead the third wavelength $\lambda_3$ of the third RF power 55 by about half-wavelength ($\lambda_2/2$, $\pi$ radians, or 180°).

Figure 6:
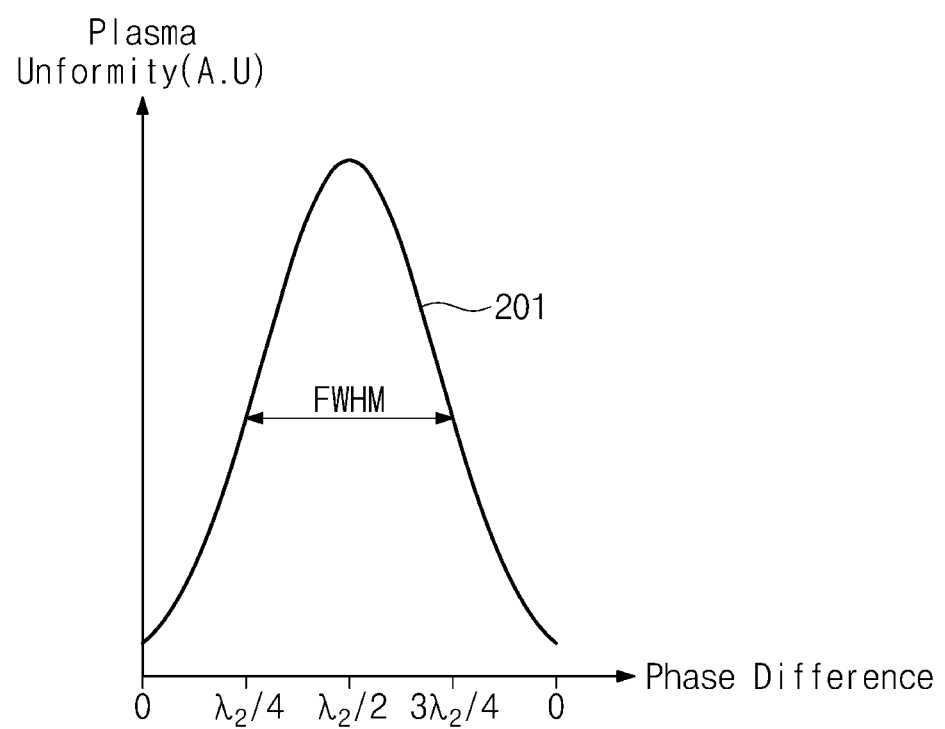
FIG. 6 illustrates a graph showing how a plasma uniformity depends on a phase difference between the second radio-frequency power and the third radio-frequency power of FIG. 2.

FIG. 6 shows how uniformity of the plasma 42 depends on a phase difference between the second RF power 53 and the third RF power 55 of FIG. 2.

Referring to FIG. 6, a plasma uniformity may be maximum when about $\pi$ radians (e.g., 180°) is given as the phase difference 11 between the second RF power 53 and the third RF power 55. For example, the second wavelength $\lambda_2$ of the second RF power 53 may precede the third wavelength $\lambda_3$ of the third RF power 55 by about half-wavelength ($\pi$ radians or $\lambda_2/2$).

The plasma uniformity may be expressed as a Gaussian distribution 201 in accordance with the phase difference 11 between the second RF power 53 and the third RF power 55. When about $\pi/2$ radians (e.g., 90°) to about $3\pi/2$ radians (e.g., 270°) is given as the phase difference 11 between the second RF power 53 and the third RF power 55, the Gaussian distribution 201 may have a full-width-at-half-maximum (FWHM). For example, the second wavelength $\lambda_2$ of the second RF power 53 may precede the third wavelength $\lambda_3$ of the third RF power 55 by about ¼ wavelength ($\pi/2$ radians or $\lambda_2/4$) to about ¾ wavelength (e.g., $3\pi/2$ radians or $3\lambda_2/4$).

Referring back to FIGS. 1 and 2, the first RF power 51, the second RF power 53, and the third RF power 55 may be pulsed. In an implementation, the first RF power 51 may be pulsed to a single level. For example, the first RF power 51 may have a first pulse 510. The first pulse 510 may be an envelope of the first frequency 51a. The first pulse 510 may have a pulse frequency of about 4 KHz to about 10 KHz. The first pulse 510 may have a duty cycle of about 50%.

The first pulse 510 may have a first inclined duration 512 and/or a first sloped duration, which corresponds to an initial period of the pulse where the power is increasing up to a desired maximum power. The first inclined duration 512 may last for about 10 microseconds to about 15 microseconds. The first inclined duration 512 may reduce a reflected power 68 of the plasma 42 based on the first RF power 51.

The second RF power 53 may be a high-frequency bias power. The second RF power 53 may be synchronized with the first RF power 51. The second RF power 53 may be pulsed at a pulse frequency the same as that at which the first RF power 51 is pulsed. For example, the second RF power 53 may have a second pulse 530. The second pulse 530 may be an envelope of the second frequency 53a. The second pulse 530 may have a pulse frequency the same as that of the first pulse 510. The pulse frequency of the second pulse 530 may range from about 4 KHz to about 10 KHz. The second pulse 530 may have a duty cycle of about 50%. The second pulse frequency may also be different from the first pulse frequency.

The second pulse 530 may have a second inclined duration 532 and/or a second sloped duration. The second inclined duration 532 may be longer than the first inclined duration 512. For example, the second inclined duration 532 may last for about 20 microseconds to about 25 microseconds. The second inclined duration 532 may reduce a reflected power 68 of the plasma 42 based on the second RF power 53.

The third RF power 55 may be a low-frequency bias power. The third RF power 55 may be synchronized with the first RF power 51 and the second RF power 53. For example, the third RF power 55 may have a third pulse 550. The third pulse 550 may be an envelope of the third frequency 55a. The third RF power 55 may be pulsed at a pulse frequency the same as that at which each of the first RF power 51 and the second RF power 53 is pulsed. The third RF power 55 may have a pulse frequency of about 4 KHz to about 10 KHz. The third pulse 550 may have a duty cycle of about 50%, but the present inventive concepts are not limited thereto. The third pulse frequency may also be different from the first and/or second pulse frequencies. The first, second and third RF powers may be provided at the same time to the electrostatic chuck. The first second and third pulses may also be provided to substantially overlap with each other in time, such as by having the pulse start and pulse end times be at the same time.

The third pulse 550 may have a third inclined duration 552 and a third sloped duration. The third inclined duration 552 may be longer than the second inclined duration 532. The third inclined duration 552 may last for about 30 microseconds to about 35 microseconds. The third inclined duration 552 may reduce a reflected power 68 of the plasma 42 based on the third RF power 55.

Referring again to FIG. 1, the current sensor 60 may be disposed between the electrostatic chuck 40 and the power supply 50. The current sensor 60 may detect currents of the RF power 58. In addition, the current sensor 60 may detect, from the chamber 10 and the electrostatic chuck 40, the reflected power 68 of the plasma 42 based on the first RF power 51, the second RF power 53, and the third RF power 55.

The RF matcher 70 may be installed between the current sensor 60 and the power supply 50. Based on a detection signal generated from the current sensor 60 that has detected the reflected power 68, the RF matcher 70 may match an impedance of the RF power 58 with an impedance of the plasma 42 in the chamber 10, thereby removing the reflected power 68. The impedance of the plasma 42 may include an impedance of the chamber 10, an impedance of the electrostatic chuck 40, and an impedance of their connection cables (not shown). When the impedance of the RF power 58 is matched with the impedance of the plasma 42, production efficiency of the plasma 42 may increase to maximum without loss of the RF power 58.

The controller 80 may be associated with the current sensor 60, the RF matcher 70, and the power supply 50. The controller 80 may be configured such that a current detection signal from the current sensor 60 is used to calculate the impedance of the RF power 58. The controller 80 may control the RF matcher 70 to match the impedance of the RF power 58 with the impedance of the plasma 42. For example, the controller 80 may provide the second RF power 53 with an increase of about 3 times to about 5 times the first RF power 51 and with an increase of about 1 times to about 7 times the third RF power 55, thereby increasing the aspect ratio of the channel hole 200 on the substrate W. The aspect ratio may increase to a value equal to or greater than about 70:1. The controller 80 may provide the second RF power 53 with a phase that is about $\pi/2$ radians to about $3\pi/2$ radians ahead of a phase of the third RF power 55, thereby increasing uniformity of the plasma 42. In addition, the controller 80 may sequentially increase the first inclined duration 512, the second inclined duration 532, and the third inclined duration 552, thereby reducing the reflected power 68. The controller can be any type of conventional controller, such as a microcontroller, dedicated hardware/circuit (e.g. digital signal processor), or a software configured general purpose processor (CPU, GPU, etc.).

It will be described below a semiconductor device fabrication method using the plasma etching apparatus 100 configured as discussed above.

Figure 7:
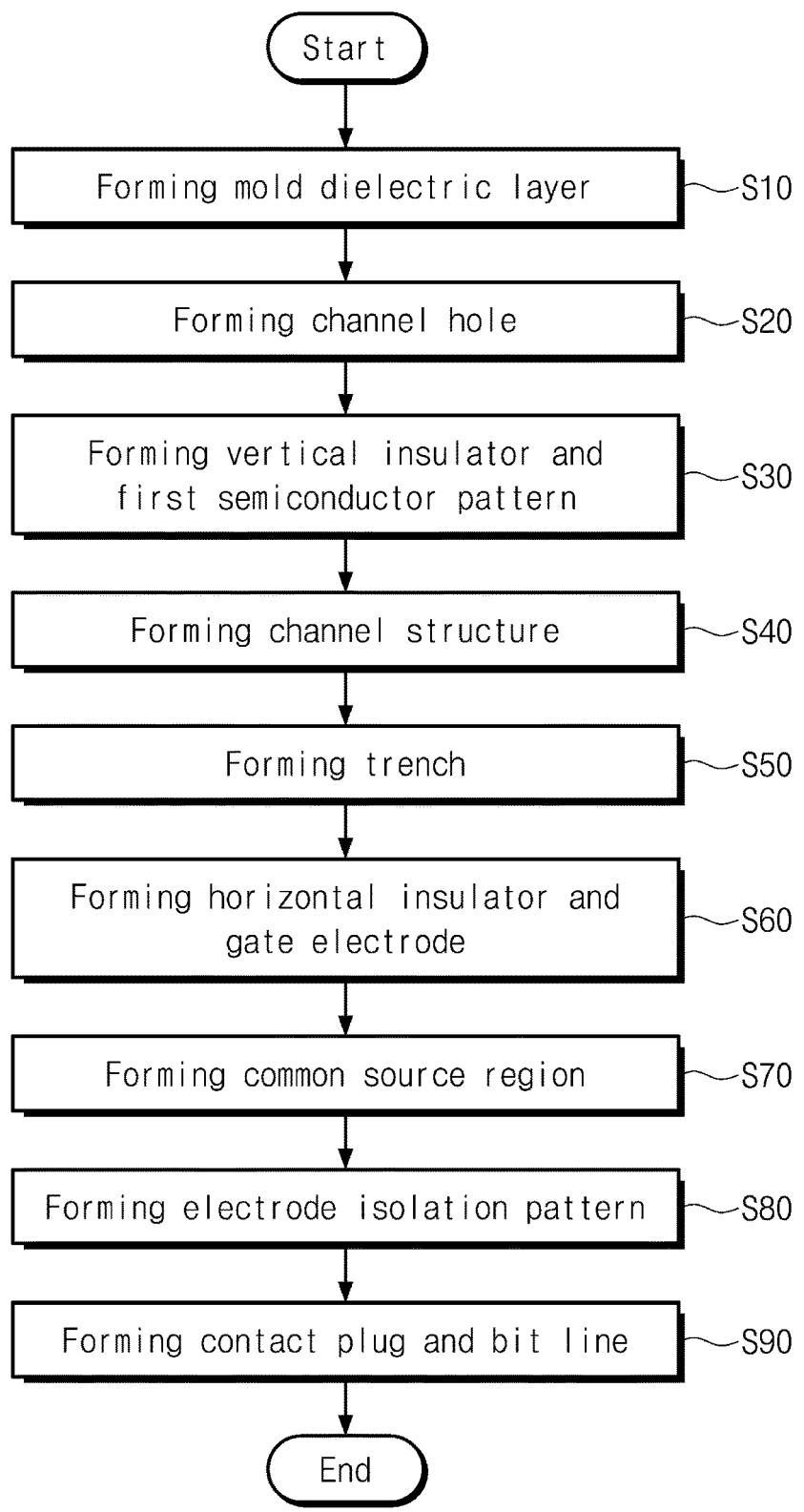
FIG. 7 illustrates a flow chart showing a semiconductor device fabrication method according to the present inventive concepts.

FIG. 7 shows a flow chart showing a semiconductor device fabrication method according to the present inventive concepts. FIGS. 8 to 16 depict cross-sectional views showing a semiconductor device fabrication method.

Figure 8:
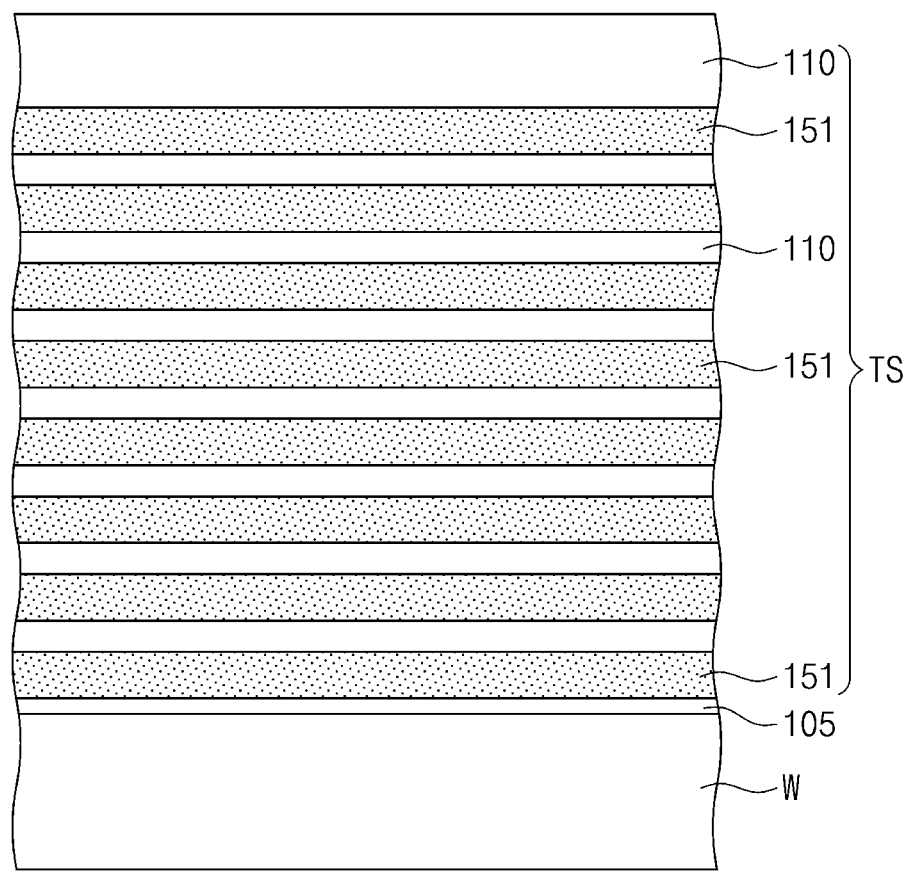
FIGS. 8 to 16 illustrate cross-sectional views showing a semiconductor device fabrication method.

Referring to FIGS. 7 and 8, a film deposition apparatus (not shown) may form a mold dielectric layer TS on the substrate W (S10). For example, the substrate W may include a silicon wafer, but the present inventive concepts are not limited thereto. A lower dielectric layer 105 may be formed between the substrate W and the mold dielectric layer TS. The lower dielectric layer 105 may include, for example, silicon oxide. The lower dielectric layer 105 may be formed by thermal oxidation. Alternatively, the lower dielectric layer 105 may be formed by chemical vapor deposition.

The mold dielectric layer TS may be deposited using thermal chemical vapor deposition (CVD), plasma enhanced CVD, physical vapor deposition (PVD), or atomic layer deposition (ALD). The mold dielectric layer TS may be thicker than the lower dielectric layer 105. For example, the mold dielectric layer TS may include sacrificial layers 151 and upper dielectric layers 110. The sacrificial layers 151 and the upper dielectric layers 110 may be formed alternately with each other. The sacrificial layers 151 and the upper dielectric layers 110 may be formed thicker than the lower dielectric layer 105.

The sacrificial layers 151 may be formed of a material that can be etched with an etch selectivity with respect to the upper dielectric layers 110. For example, the sacrificial layers 151 may include one or more of polysilicon, silicon oxide, silicon carbide, silicon oxynitride, and silicon nitride. In an implementation, the sacrificial layers 151 may have the same thickness as each other.

The upper dielectric layer 110 may be formed between the sacrificial layers 151. For example, the upper dielectric layers 110 may include one or more of polysilicon, silicon oxide, silicon carbide, silicon carbonitride, silicon oxycarbide, silicon oxynitride, silicon nitride, or other suitable materials, and the material of the upper dielectric layer 110 may be different from that of the sacrificial layers 151. An uppermost one of the upper dielectric layers 110 may be formed thicker than an uppermost one of the sacrificial layers 151. For example, the sacrificial layers 151 may include silicon nitride, and the upper dielectric layers 110 may include silicon oxide. Therefore, the mold dielectric layer TS may be a composite layer of silicon nitride and silicon oxide. Alternatively, the mold dielectric layer TS may be a single layer, such as a single layer of silicon oxide.

Figure 9:
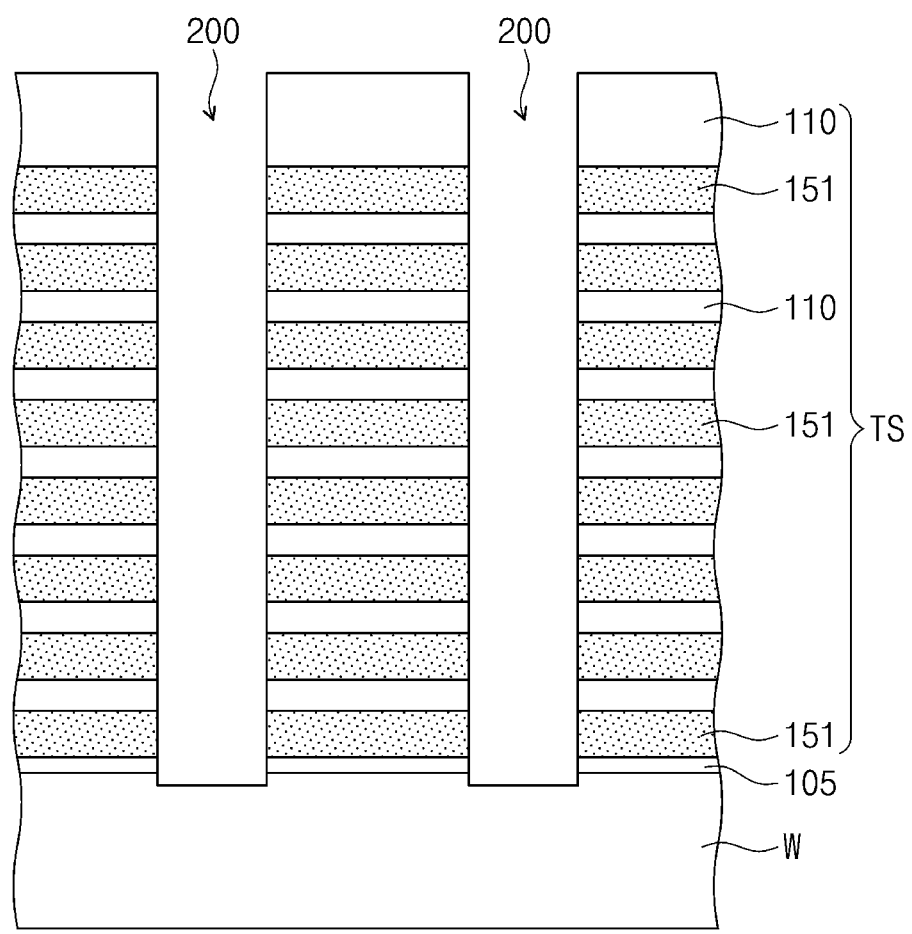

Referring to FIGS. 1 and 9, the plasma etching apparatus 100 may form channel holes 200 in the mold dielectric layer TS (S20). In an implementation, the channel holes 200 may be formed by photolithography and etching processes performed on the mold dielectric layer TS. The photolithography process may form a first mask pattern (not shown) having openings that define regions where the channel holes 200 will be formed. The etching process may remove portions of the mold dielectric layer TS that are exposed by the first mask pattern. A dry etching process may be adopted as the etching process performed on the mold dielectric layer TS. A top surface of the substrate W may be partially etched during the etching process. Therefore, the top surface of the substrate W may be recessed. Alternatively, the etching process may form the channel holes 200 each having a width at its lower portion less than a width at its upper portion. Dissimilarly, the etching process may form the channel holes 200 each having a width at its lower portion substantially the same as a width at its upper portion. Afterwards, the first mask pattern may be removed by an ashing process or a cleaning process.

An aspect ratio of the channel hole 200 may be in proportion to integration of a semiconductor device. When the channel hole 200 has an increased aspect ratio, the mold dielectric layer TS may have an increased thickness. The increase in thickness of the mold dielectric layer TS may increase integration of a semiconductor device. Therefore, the aspect ratio of the channel hole 200 may be in proportion to integration of a semiconductor device.

The following description will focus on a method of increasing the aspect ratio of the channel hole 200.

Figure 17:
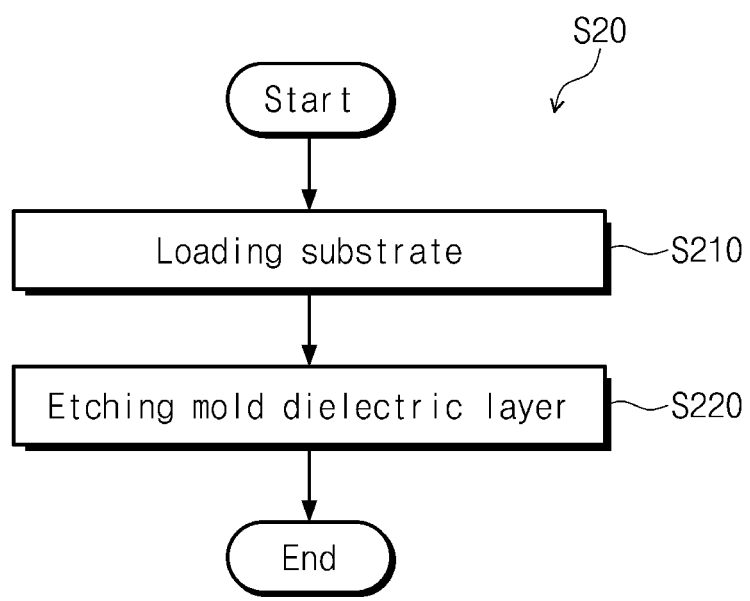
FIG. 17 illustrates a flow chart showing an example of a step of forming a channel hole depicted in FIG. 9.

FIG. 17 shows an example of the step S20 of forming the channel hole 200 depicted in FIG. 9.

Referring to FIGS. 1 and 17, when the substrate W is provided in the chamber 10, the electrostatic chuck 40 may load the substrate W (S210). The electrostatic chuck 40 may use an electrostatic voltage to hold the substrate W.

Afterwards, the mold dielectric layer TS may be etched with the plasma 42 that is induced by the RF power 58 provided from the power supply 50 (S220). The mold dielectric layer TS may be an etch target on the substrate W. The gas supply 20 may provide the chamber 10 with the process gas 22.

Figure 18:
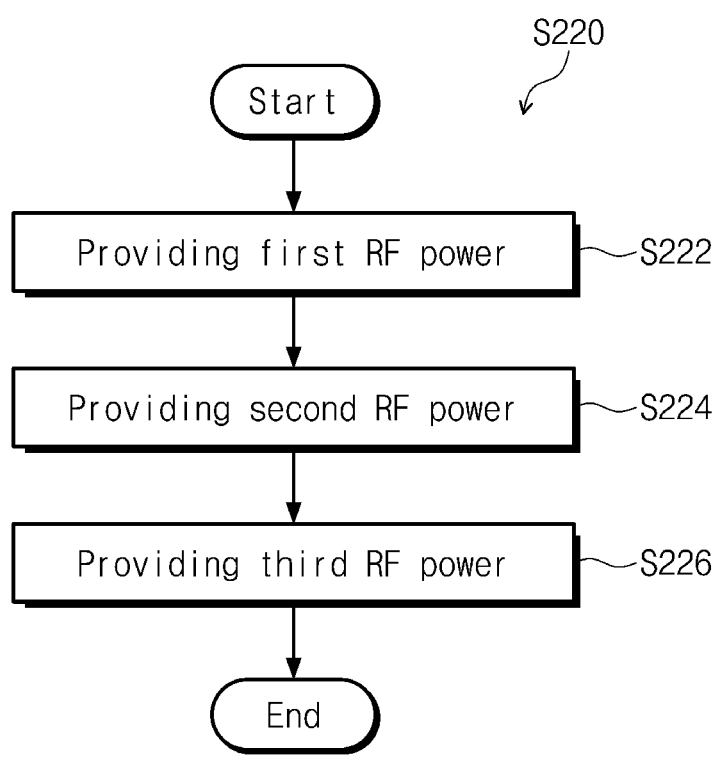
FIG. 18 illustrates a flow chart showing an example of a step of etching a mold dielectric layer depicted in FIG. 9.

FIG. 18 shows an example of the step S220 of etching the mold dielectric layer TS depicted in FIG. 9.

Referring to FIGS. 1 and 18, the first power supply 52 may provide the electrostatic chuck 40 with the first RF power 51 to generate the plasma 42 on the substrate W (S222). The plasma 42 may have an intensity in proportion to the first RF power 51. For example, the first RF power 51 may range from about 4 KW to about 6 KW. The first RF power 51 may have the first frequency 51a of about 60 MHz. In addition, the first RF power 51 may have the first pulse 510. The first pulse 510 may be an envelope of the first frequency 51a. The first pulse 510 may have a pulse frequency of about 4 KHz to about 10 KHz. Moreover, the first pulse 510 may have a duty cycle of about 50%, but the present inventive concepts are not limited thereto. The first pulse 510 may have the first inclined duration 512. The first inclined duration 512 may last for about 15 microseconds. The first inclined duration 512 may reduce the reflected power 68 of the plasma 42 based on the first RF power 51.

Thereafter, the second power supply 54 may provide the electrostatic chuck 40 with the second RF power 53 to concentrate the plasma 42 on the substrate W (S224). The second RF power 53 may increase the intensity and/or a density of the plasma 42 and the aspect ratio of the channel hole 200. In an implementation, the second RF power 53 may be about 3 times to about 5 times the first RF power 51. For example, the second RF power 53 may range from about 12 KW to about 28 KW. When the second RF power 53 is about 3 times less than or about 5 times greater than the first RF power 51, an upper clogging or overhang may occur at an upper portion of the channel hole 200. The second RF power 53 that is about 3 times to about 5 times the first RF power 51 may increase the aspect ratio of the channel hole 200 without the upper clogging or overhang of the channel hole 200. The second RF power 53 may have the second frequency 53a. The second frequency 53a may be less than the first frequency 51a. The second frequency 53a may be about 2 MHz. The second RF power 53 may have the second pulse 530. The second pulse 530 may be an envelope of the second frequency 53a. The second pulse 530 may be the same as the first pulse 510. The second pulse 530 may have a duty cycle of about 50%. The second pulse 530 may range from about 4 KHz to about 10 KHz. The second pulse 530 may have the second inclined duration 532. The second inclined duration 532 may be longer than the first inclined duration 512. The second inclined duration 532 may last for about 20 microseconds. The second inclined duration 532 may reduce the reflected power 68 of the plasma 42 based on the second RF power 53.

After that, the third power supply 56 may provide the electrostatic chuck 40 with the third RF power 55 to concentrate the plasma 42 toward the substrate W (S226). The third RF power 55 may be the same as or greater than the first RF power 51. The third RF power 55 may be the same as or less than the second RF power 53. The third RF power 55 may be about ⅐ to 1 times the second RF power 53. For example, the third RF power 55 may range from about 4 KW to about 21 KW. The third RF power 55 may have the third frequency 55*a*. The third frequency 55*a* may be less than the second frequency 53*a*. The third frequency 55*a* may be about 400 KHz. The third RF power 55 may have the third pulse 550. The third pulse 550 may be an envelope of the third frequency 55*a*. The third pulse 550 may be the same as the second pulse 530. The third pulse 550 may range from about 4 KHz to about 10 KHz. The third pulse 550 may have the third inclined duration 552. The third inclined duration 552 may be longer than the second inclined duration 532. The third inclined duration 552 may last for about 30 microseconds. The third inclined duration 552 may reduce the reflected power 68 of the plasma 42 based on the third RF power 55.

Figure 10:
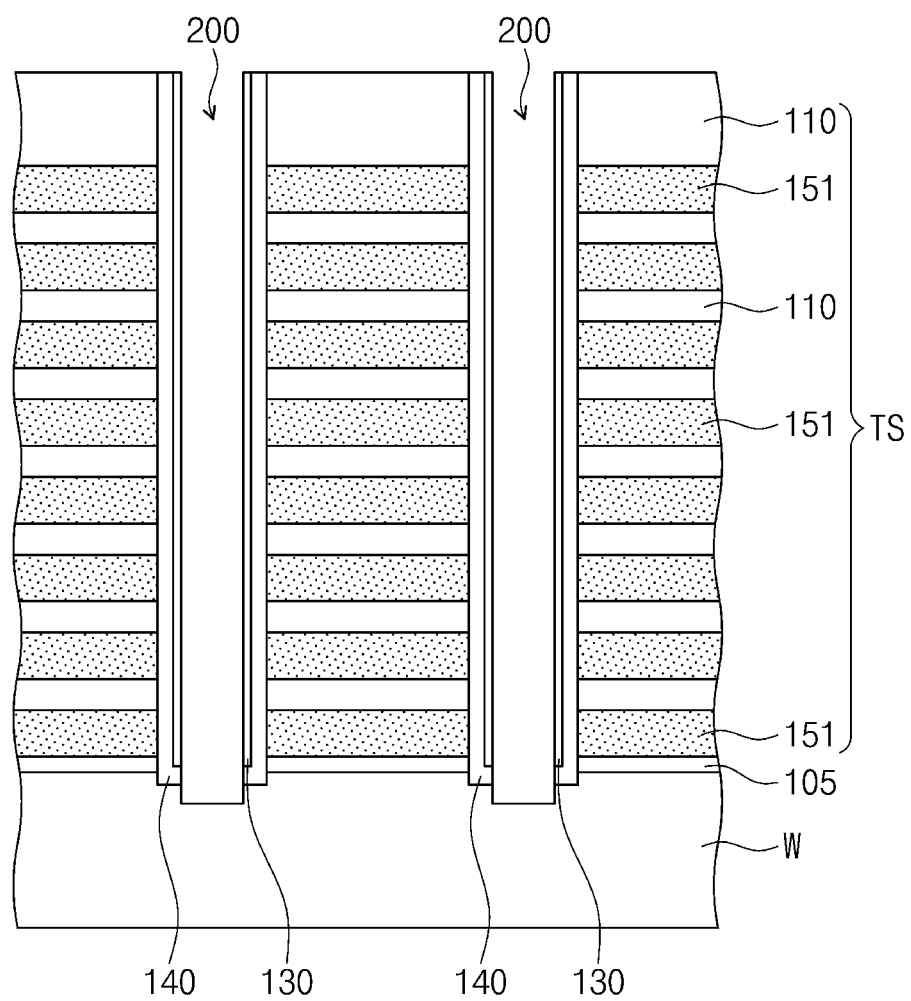

Referring to FIGS. 7 and 10, a film deposition apparatus may form a vertical insulator 140 and a first semiconductor pattern 130 on an inner wall of the channel hole 200 (S30). For example, a vertical dielectric layer and a first semiconductor layer may be conformally formed on the inner wall of the channel hole 200 and on the substrate W. The vertical dielectric layer and the first semiconductor layer may be deposited by plasma enhanced chemical vapor deposition (CVD), physical vapor deposition (PVD), or atomic layer deposition (ALD).

The vertical dielectric layer may include a charge storage layer that is used as a memory element of a Flash memory device. For example, the charge storage layer may be a trap dielectric layer or a dielectric layer that includes conductive nano-dots. Alternatively, the vertical dielectric layer may include a thin film for a phase change memory device or for a variable resistance memory device. In an implementation, the vertical dielectric layer may include a blocking dielectric layer, a charge storage layer, or a tunnel dielectric layer. The blocking dielectric layer may cover sidewalls of the sacrificial layers 151, sidewalls of the upper dielectric layers 110, and the top surface of the substrate W, which sidewalls and top surface are exposed to the channel hole 200. The blocking dielectric layer may include, for example, silicon oxide. The charge storage layer may include a trap dielectric layer or a dielectric layer that includes conductive nano-dots. For example, the charge storage layer may include one or more of silicon nitride, silicon oxynitride, silicon-rich nitride, nano-crystalline silicon, and a laminated trap layer. The tunnel dielectric layer may be one of materials that have their bandgap greater than that of the charge storage layer. For example, the tunnel dielectric layer may be silicon oxide.

The first semiconductor layer may be formed on the vertical dielectric layer. For example, the first semiconductor layer may include polycrystalline silicon, single-crystalline silicon, or amorphous silicon.

After the vertical dielectric layer and the first semiconductor layer are sequentially formed, the first semiconductor layer and the vertical dielectric layer may be anisotropically etched to partially expose the substrate W. Accordingly, the first semiconductor pattern 130 and the vertical insulator 140 may be formed on the inner wall of the channel hole 200. The vertical insulator 140 and the first semiconductor pattern 130 may each have a cylindrical shape whose opposite ends are opened. While the first semiconductor layer and the vertical dielectric layer are anisotropically etched, the top surface of the substrate W may be recessed due to overetching.

Moreover, the anisotropic etching of the first semiconductor layer and the vertical dielectric layer may expose a top surface of the mold dielectric layer TS. Therefore, the vertical insulator 140 and the first semiconductor pattern 130 may be formed locally in the channel hole 200.

Figure 11:
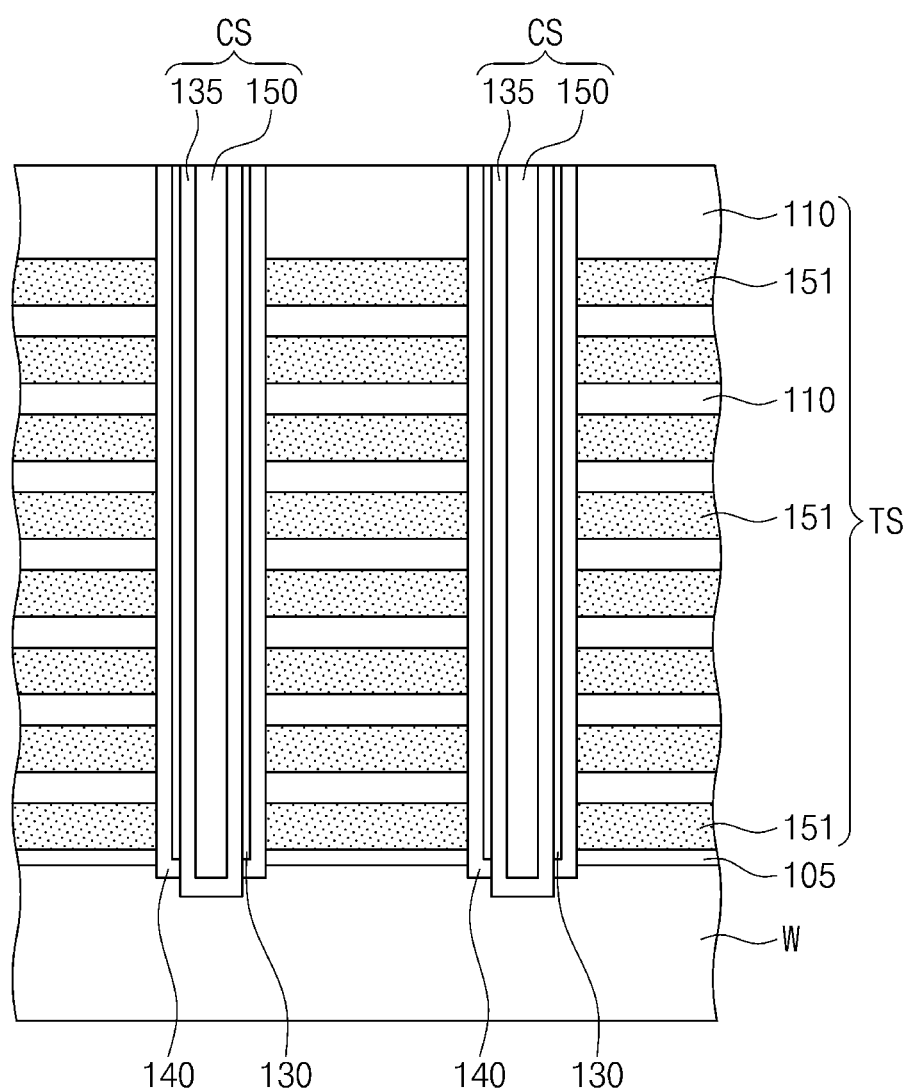

Referring to FIGS. 7 and 11, a film deposition apparatus may form a channel structure CS on the vertical insulator 140, the first semiconductor pattern 130, and the substrate W in the channel hole 200 (S40). The channel structure CS may include a second semiconductor pattern 135 and a vertical dielectric pattern 150. For example, the second semiconductor pattern 135 and the vertical dielectric pattern 150 may be formed by depositing a second semiconductor layer and a dielectric layer, and then planarizing the second semiconductor layer and the dielectric layer. For example, the second semiconductor layer and the dielectric layer may be sequentially formed on the substrate W. The second semiconductor layer may be conformally formed to have a thickness insufficient to completely fill the channel hole 200. The second semiconductor layer may include a semiconductor material (e.g., polycrystalline silicon, single-crystalline silicon, or amorphous silicon) formed using one of atomic layer deposition (ALD) and chemical vapor deposition (CVD). The dielectric layer may be formed to completely fill the channel hole 200. The dielectric layer may be one of silicon oxide and a dielectric material that are formed using spin-on-glass (SOG) technology. Subsequently, the second semiconductor layer and the dielectric layer may be planarized to expose the top surface of the mold dielectric layer TS, and thus the second semiconductor pattern 135 and the vertical dielectric pattern 150 may be formed locally in the channel hole 200.

The channel hole 200 may be provided therein with the second semiconductor pattern 135 that is formed to have a cup shape, a pipe shape whose one end is closed, or a hollow cylindrical shape whose one end is closed. Alternatively, the second semiconductor pattern 135 may be formed to have a pillar shape that fills the channel hole 200.

The vertical dielectric pattern 150 may be formed to fill the channel hole 200.

Figure 12:
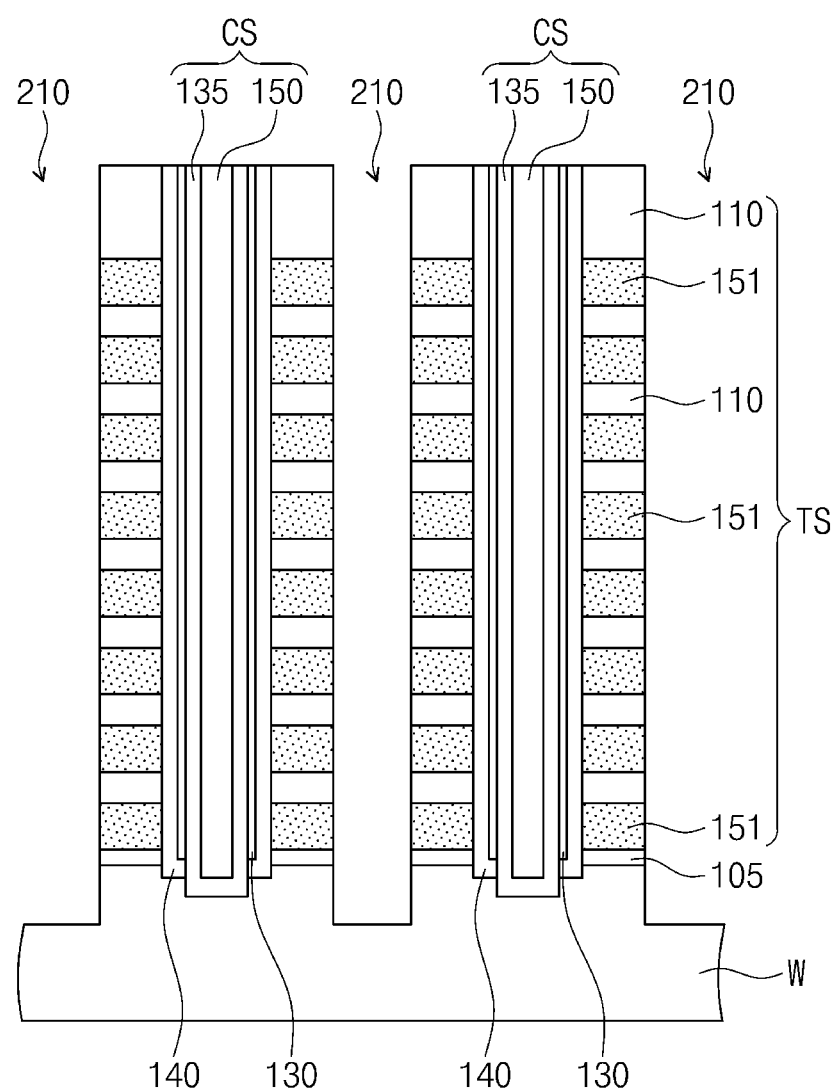

Referring to FIGS. 7 and 12, a trench 210 may be formed by partially etching the mold dielectric layer TS between the channel holes 200 (S50). The trench 210 may partially expose the substrate W.

Figure 13:
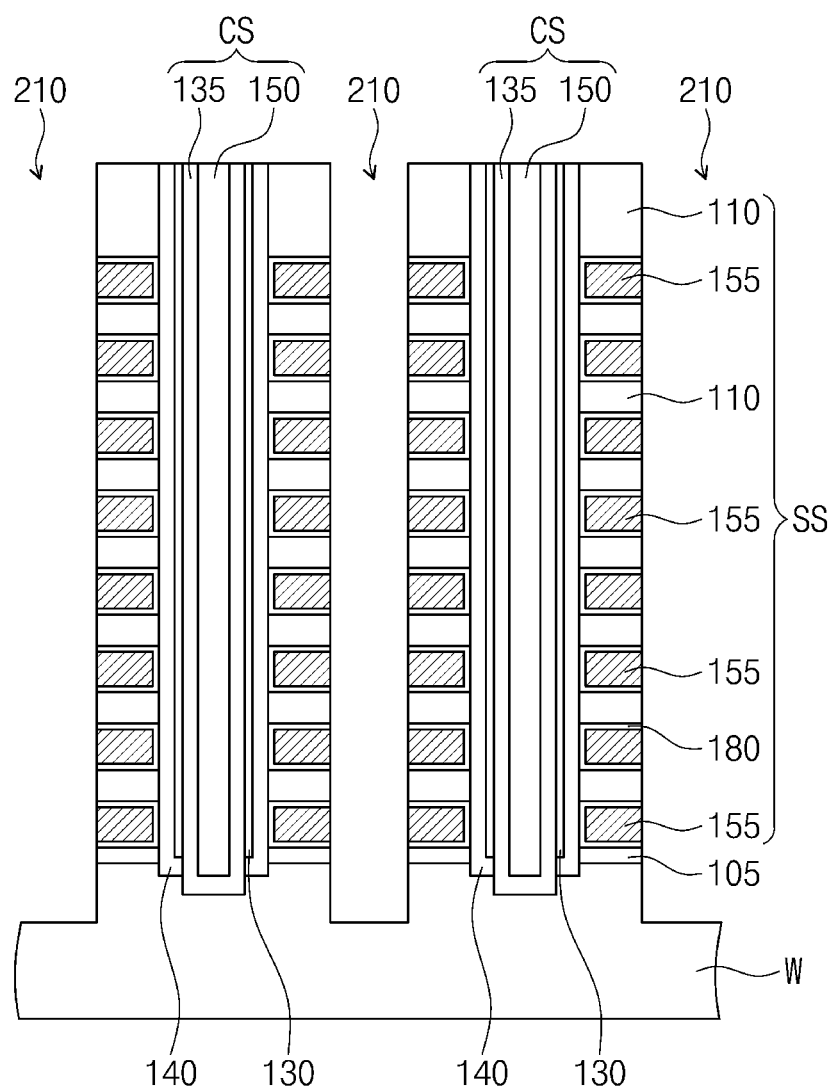

Referring to FIGS. 7 and 13, an etching process may form recess regions by removing the sacrificial layers 151 exposed to the trench 210, and a film deposition apparatus may form horizontal insulators 180 and gate electrodes 155 in the recess regions (S60). The recess region may be a gap that horizontally extends from the trench 210, and may be formed to partially expose a sidewall of each of the vertical insulator 140 and the upper dielectric layer 110. The horizontal insulator 180 may be formed to cover an inner wall of the recess region.

The gate electrode 155 may be formed to fill a remaining portion of the recess region in which the horizontal insulator 180 is formed. The step S60 of forming the horizontal insulator 180 and the gate electrode 155 may include sequentially forming a horizontal layer and a gate layer (e.g., a metal layer) that sequentially fill the recess region, and then removing the horizontal layer and the gate layer from the trench 210. The horizontal insulator 180 may include a data storage layer. Similar to the vertical insulator 140, the horizontal insulator 180 may be formed of a single thin layer or a plurality of thin layers. In an implementation, the horizontal insulator 180 may include a blocking dielectric layer of a charge-trap type nonvolatile memory transistor.

A stack structure SS may be defined which includes the gate electrodes 155 and the upper dielectric layers 110 that are sequentially stacked.

Figure 14:
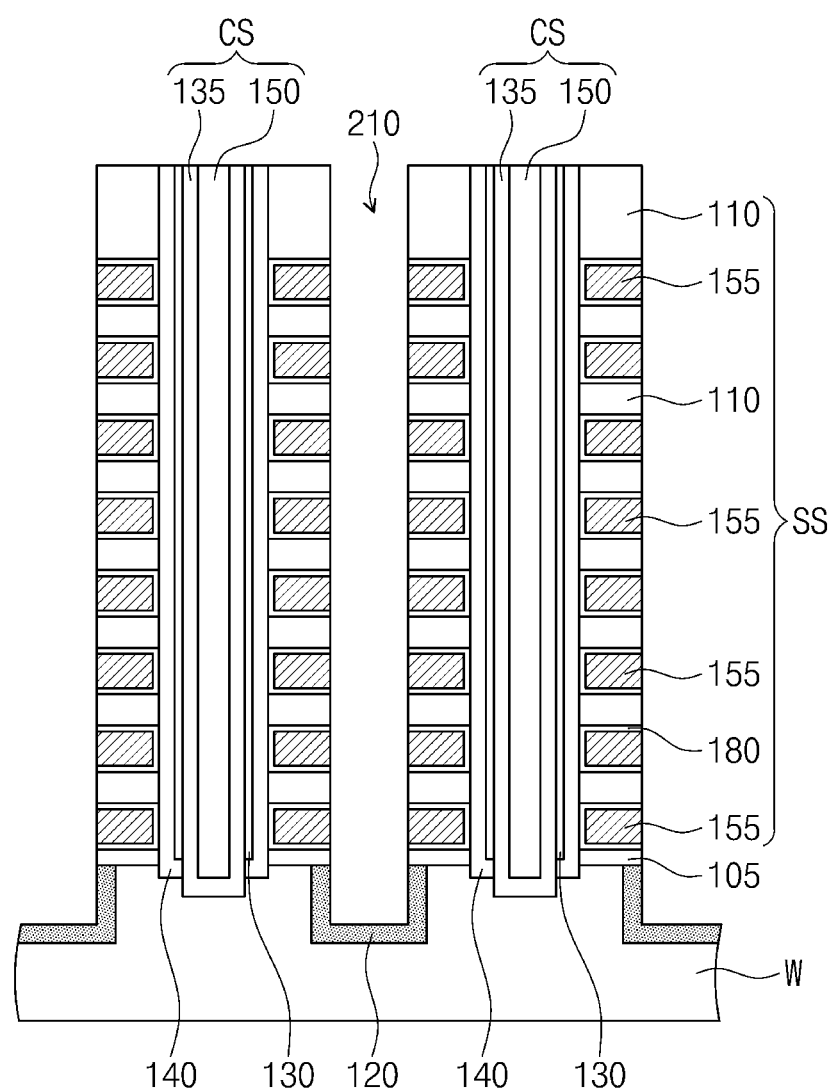

Referring to FIGS. 7 and 14, a diffusion apparatus or an ion implantation apparatus may be used to form a common source region 120 on the substrate W in the trench 210 (S70). An ion implantation process may form the common source region 120 in the substrate W exposed to the trench 210. The common source region 120 and the substrate W may constitute a PN junction. For example, the common source regions 120 may be connected to each other to have the same potential state. Alternatively, the common source regions 120 may be electrically separated to have different electrical potentials from each other. In an implementation, the common source regions 120 may constitute a plurality of source groups which are electrically independent of each other and each of which includes corresponding ones of the common source regions 120, and the plurality of source groups may be electrically separated to have different electrical potentials from each other.

Figure 15:
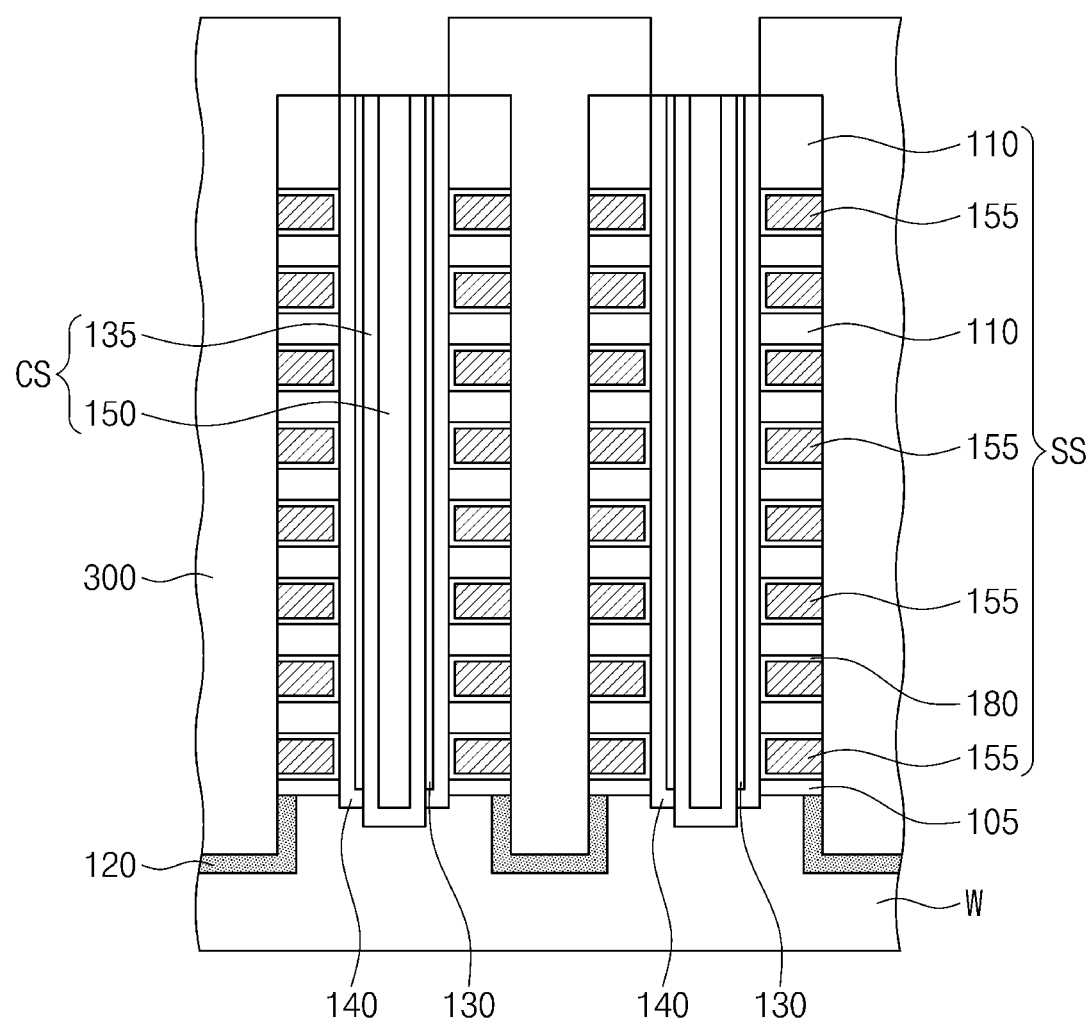

Referring to FIGS. 7 and 15, a film deposition apparatus and an etching apparatus may form an electrode isolation pattern 300 in the trench 210 on the common source region 120 (S80). The electrode isolation pattern 300 may be formed of one or more of silicon oxide, silicon nitride, and silicon oxynitride. For example, the electrode isolation pattern 300 may be patterned by a photolithography process or an etching process. The channel structure CS may be exposed by the electrode isolation pattern 300.

Figure 16:
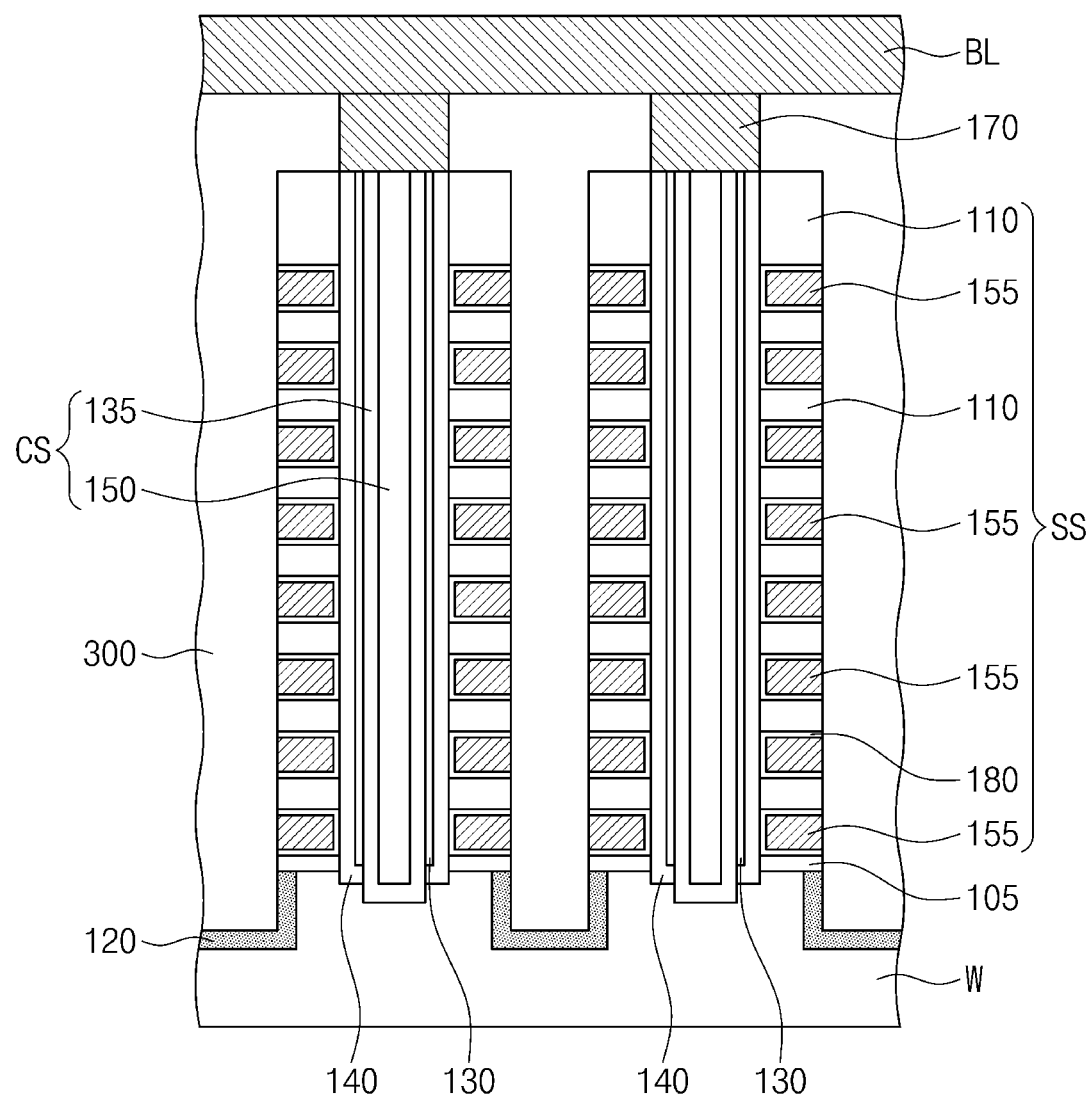

Referring to FIGS. 7 and 16, a film deposition apparatus and an etching apparatus may form a contact plug 170 and a bit line BL on the first semiconductor pattern 130 and the channel structure CS (S90). The contact plug 170 may be connected to the first semiconductor pattern 130 and the channel structure CS. For example, the contact plug 170 may be formed by recessing upper portions of the first semiconductor pattern 130 and the channel structure CS, and then filling the recessed portions with a conductive material.

The bit line BL may be formed on the contact plug 170 and the electrode isolation pattern 300. The bit line BL may be electrically connected through the contact plug 170 to the first and second semiconductor patterns 130 and 135.

As discussed above, a plasma etching method according to some example embodiments of the present inventive concepts may increase an aspect ratio of a channel hole on a substrate by increasing a second RF power more than first and third RF powers among the first to third RF powers.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A plasma etching method, comprising:
providing a plasma etching chamber having a gas supply, an electrostatic chuck having thereon a sample to be etched, a radio frequency source inducing a plasma on the sample, and a controller;
providing a gas from the gas supply to the etching chamber;
providing the electrostatic chuck with a first radio-frequency power having a first frequency;
providing the electrostatic chuck with a second radio-frequency power having a second frequency, the second radio-frequency power being greater than the first radio-frequency power, and the second frequency being less than the first frequency; and
providing the electrostatic chuck with a third radio-frequency power having a third frequency, the third radio-frequency power being less than the second radio-frequency power, and the third frequency being less than the second frequency,
wherein the second radio-frequency power is from 3 times to 5 times the first radio-frequency power.

2. The plasma etching method of claim 1, wherein the second radio-frequency power is about 4 times the first radio-frequency power and the third radio-frequency power.

3. The plasma etching method of claim 1, wherein a phase of the second radio-frequency power precedes a phase of the third radio-frequency power by about 7C radians.

4. The plasma etching method of claim 1, wherein
the first radio-frequency power has a first pulse including a first inclined duration,
the second radio-frequency power has a second pulse including a second inclined duration longer than the first inclined duration, and
the third radio-frequency power has a third pulse including a third inclined duration longer than the second inclined duration.

5. The plasma etching method of claim 4 wherein
the first inclined duration lasts for about 10 microseconds to about 15 microseconds,
the second inclined duration lasts for about 20 microseconds to about 25 microseconds, and
the third inclined duration lasts for about 30 microseconds to about 35 microseconds.

6. A semiconductor device fabrication method, comprising:
allowing an electrostatic chuck to load a substrate having an etch target; and
etching the etch target using a plasma,
wherein etching the etch target includes:
providing the electrostatic chuck with a first radio-frequency power having a first frequency;
providing a second radio-frequency power having a second frequency, the second radio-frequency power being greater than the first radio-frequency power, and the second frequency being less than the first frequency; and
providing a third radio-frequency power having a third frequency, the third radio-frequency power being less than the second radio-frequency power, and the third frequency being less than the second frequency,
wherein the second radio-frequency power is from 3 times to 5 times the first radio-frequency power.

7. The semiconductor device fabrication method of claim 6, wherein the etch target includes a mold dielectric layer, wherein etching the etch target includes removing a portion of the mold dielectric layer to form a channel hole.

8. The semiconductor device fabrication method of claim 7, further comprising:
forming a vertical insulator and a first semiconductor pattern on an inner wall of the channel hole;
forming a channel structure on the vertical insulator, the first semiconductor pattern, and the substrate; and forming a trench by partially etching the mold dielectric layer between a plurality of channel holes.

9. The semiconductor device fabrication method of claim 8, further comprising:
   forming a recess region by removing a sacrificial layer of the mold dielectric layer, the sacrificial layer being exposed to the trench;
   forming a horizontal insulator and a gate electrode in the recess region;
   forming a common source region on the substrate in the trench;
   forming an electrode isolation pattern in the trench on the common source region; and
   forming a contact plug and a bit line on the first semiconductor pattern and the channel structure.

10. The semiconductor device fabrication method of claim 7, wherein an aspect ratio of the channel hole is greater than about 70:1.

\* \* \* \* \*